Figure 1:
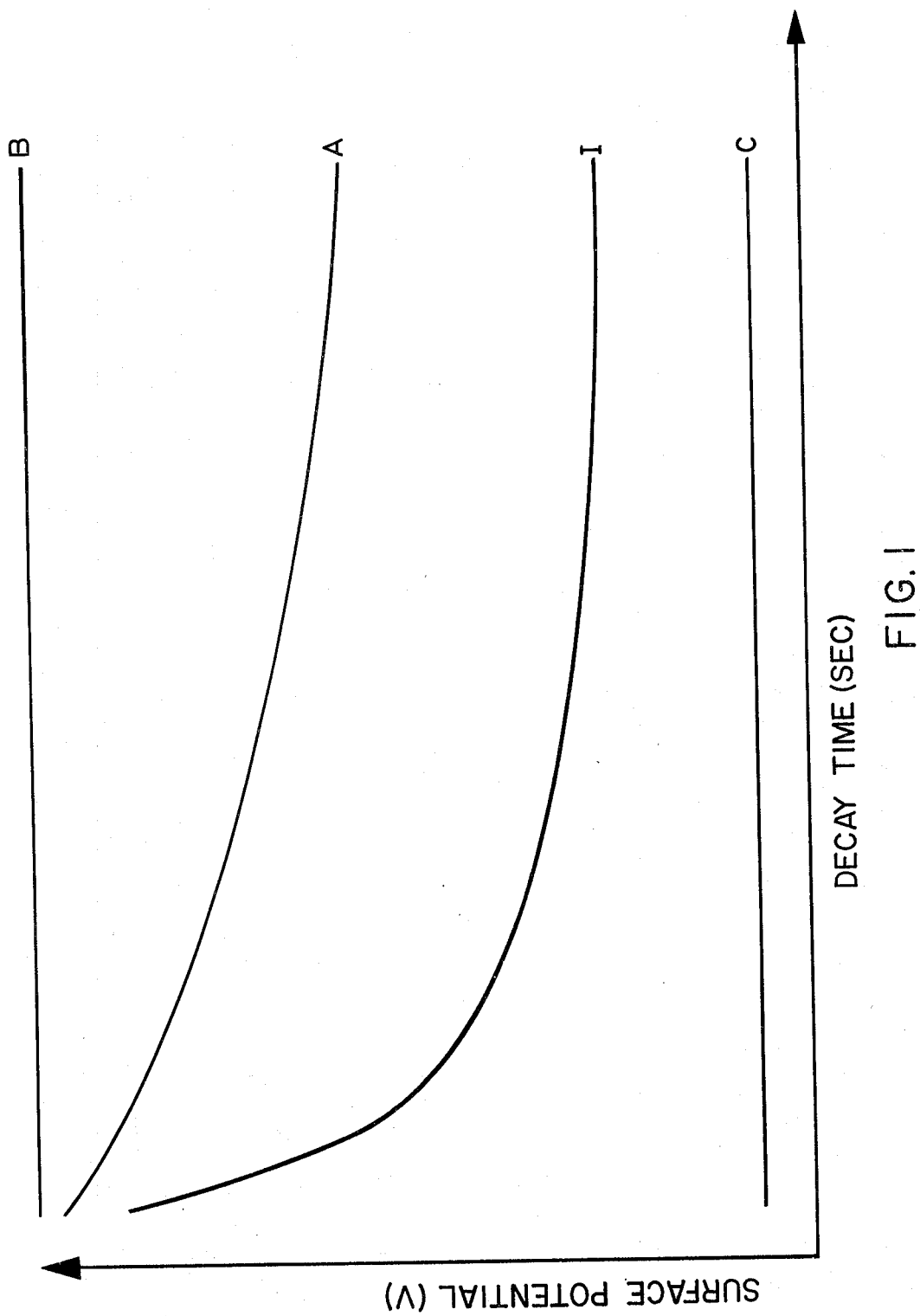

United States Patent [19]
Lind et al.

[11] 4,087,828
[45] May 2, 1978

[54] PROCESS FOR THE STORAGE AND REPRODUCTION OF INFORMATION

[75] Inventors: Erwin Lind, Auringen; Dieter Messner, Wiesbaden-Biebrich, both of Germany

[73] Assignee: Hoechst Aktiengesellschaft, Frankfurt, Germany

[21] Appl. No.: 334,357

[22] Filed: Feb. 21, 1973

[30] Foreign Application Priority Data

Feb. 24, 1972 Germany .............................. 2208727

[51] Int. Cl.² .................................................. H04N 1/30
[52] U.S. Cl. .................................... 346/158; 358/300
[58] Field of Search ............ 346/74 P, 74 EB, 74 CR, 346/160, 158, 159, 153; 355/17, 20, 3 R, 3 DD; 96/1 R, 1 A, 1 C, 1 PC, 1.5; 358/300

[56] References Cited

U.S. PATENT DOCUMENTS

| | | |
|---|---|---|
| 2,845,348 | 7/1958 | Kallman .............................. 355/17 |
| 3,653,064 | 3/1971 | Inoue et al. ...................... 346/74 EB |
| 3,673,595 | 6/1972 | Inoue et al. ...................... 346/74 EB |

*Primary Examiner*—Raymond F. Cardillo, Jr.
*Attorney, Agent, or Firm*—Stevens, Davis, Miller & Mosher

[57] ABSTRACT

A process for patterned storage and reproduction of information in which a photoconductive recording material is altered by an electron beam in correspondence with the information, a free charge is applied to the photoconductive recording material and the flowing off of this charge is made visible differing in correspondence with the pattern.

2 Claims, 2 Drawing Figures

1. ELECTRON RADIATION —

2. CHARGING —

3. APPLYING TONER —

PROCESS FOR THE STORAGE AND REPRODUCTION OF INFORMATION

The present invention relates to a process for storing and reproducing information, in which photoconductive recording material is altered by means of an electron beam in correspondence with the information and used for the reproduction of the information.

Processes for recording, storing, and reproducing information with the use of electron beams are known. British Patent Specification No. 1,057,947 describes a recording process using electron beams in which the recording material constitutes layers containing ethylenically unsaturated compounds which polymerize upon the action of electron beams. Such layers have little resistance to storage, particularly when they additionally contain initiators. The ethylenically unsaturated layers are further known to undergo photopolymerization easily so that, during processing, they have to be treated as light-sensitive material. Furthermore, it has been proven that layers from ethylenically unsaturated compounds polymerize spontaneously in a vacuum since in such a case the inhibiting oxygen is absent.

There is also known from German Offenlegungsschrift No. 1,622,285 a process for the production of etched images which is based on the action of corpuscular rays on layers of homo- or copolymers of maleic acid anhydride. The action of radiation changes the solubility of the layer. This process is limited to the production of etched images since the radiation causes only solubility differences between irradiated and non-irradiated areas.

It further is known from German Offenlegungsschrift No. 1,497,161 to chemically activate inorganic photoconductor layers imagewise by electron beams. The energy supply by the electron beam is so high that the irradiated substances accept electrons and change to a lower oxidation stage. In this chemically activated state, they are then in a position to separate metals, particularly noble metals, from solutions of metal ions, e.g. from silver nitrate solution.

It is the object of the present invention to provide a process for the imagewise recording of information which overcomes the described drawbacks and which may generally be employed with the use of a receiving material unaffected by storing and which is not dependent on relatively expensive developing materials.

The present invention provides a process for the storage and reproduction of information, in which photoconductive recording material is altered by means of an electron beam in correspondence with the information and used for the reproduction of the information. The process is characterized by image wise producing a conductivity pattern on photoconductive recording material, to which pattern a free charge is applied, and flowing off of this free charge differing in correspondence with this pattern to make the pattern visible. According to the present invention, the photoconductive recording material provided with the conductivity pattern is uniformly charged over the entire surface and the charge pattern formed is made visible with an electrophotographic developer.

According to another embodiment of the process of the present invention, it also is possible to scan the photoconductive recording material provided with the conductivity pattern by means of an electron beam the energy of which is lower than that of the recording electron beam and to use the current produced by the electron beam at every instant of scanning the photoconductor for reproduction. The current produced with scanning is preferably directly used for controlling a cathode ray tube operated synchronously to the scanning electron beam. Synchronously means that, in the case of scanning with the use of rectangular pulses, the line frequency and the column frequency are equal and triggering is effected by the same pulser. In accordance with the present invention, it also is possible, however, to use the current produced with scanning and chronologically change it in correspondence with the information for magnetizing a magnetic tape to achieve stored information on the magnetic tape.

With the use of inexpensive recording materials having an unlimited storage life, the process of the present invention thus permits general application in the reproduction field for the manufacture of copies or printing plates as well as for the electronic transmission or information storage over any period of time.

Figure 2:
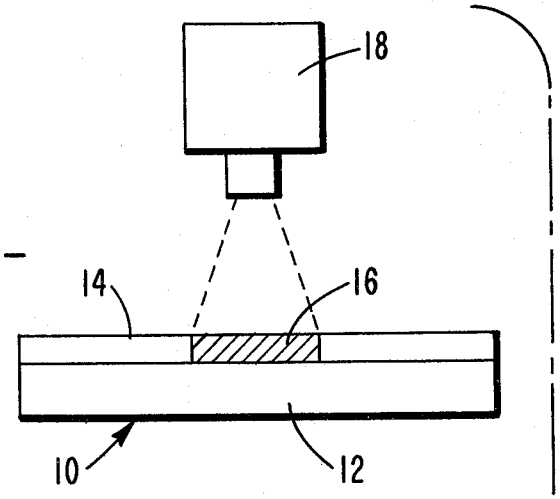
Figure 2:
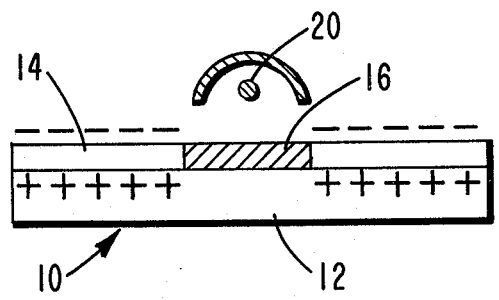
Figure 2:
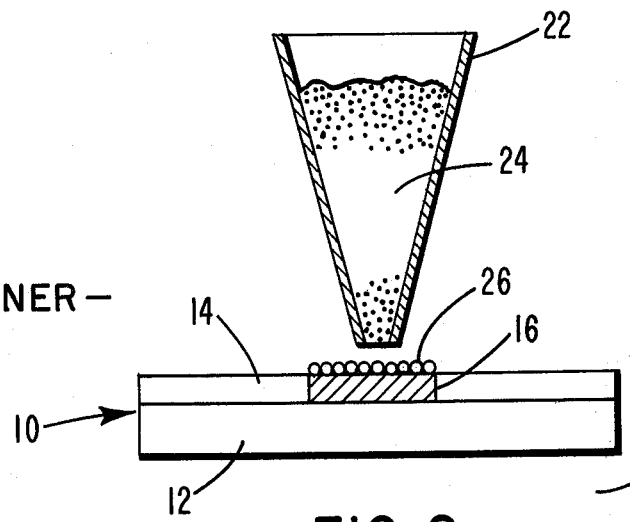

Other details and features of the invention will stand out from the description given below by way of non-limitative example and with reference to the accompanying drawings, in which:

FIG. 1 is a graph showing photoconductivity curves of irradiated photoconductor layers; and FIG. 2 is a schematic diagram of process steps for making visible an imagewise conductivity pattern.

It has been found that, upon the action of electron beams on photoconductor layers, effects occur which may be different in nature. The irradiation may thus cause a decrease of the electrophotographic sensitivity as shown by Case I of FIG. 1, i.e., the photoeffect to be observed in the photoconductor layer becomes lower as shown by Case A. The photoconductor layer may also completely lose its photoconductivity by irradiation and become an insulator as shown in Case B or the photoconductor layer becomes a dark conductor as shown in Case C. In most cases, however, transitions between these stages occur and the described possibilities are only border cases.

Whichever of the three described possibilities occurs in the individual case is unimportant for the performance of the process of the present invention and for the achieved result. It is essential that imagewise differentiation is achieved by irradiation.

Suitable photoconductor layers are layers consisting of or containing organic or inorganic photoconductors. It has proved particularly advantageous to use layers with organic photoconductors, known monomer or polymer compounds being suitable. As photoconductor monomers, heterocyclics carrying at least one dialkyl substituted amino group, e.g. oxidiazole derivatives (German Patent No. 1,058,836 — British Patent Specification No. 851,218 — U.S. Pat. No. 3,189,447 — Canadian Patent No. 611,852), oxazole derivatives (German Patent No. 1,120,875 — British patent specification No. 874,634 — U.S. Pat. No. 3,257,203 — Canadian Patent Nos. 902,980 and 806,97), benzthiazole derivatives (German Patent No. 1,137,625 — British patent specification No. 895,001 — U.S. Pat. No. 3,257,204 — Canadian Patent No. 641,920) have proven to be particularly suitable. Examples of polymer photoconductors which have proved particularly suitable are polyvinyl carbazole (German Patent No. 1,068,15 — British patent specification No. 856,770 — U.S. Pat. No. 3,037,861 — Canadian Patent No. 746,848), copolymers from N-vinyl carbazole and styrene, vinyl aromatic polymers, such as polyvinyl anthracene or polyacenaphthylene. Similarly suitable are, for example, condensation products from formaldehyde and pyrene (German Patent No. 1,218,286 — British patent specification No. 1,021,994), which may be substituted or unsubstituted. The photoconductive recording material contains this photoconductor generally in admixture with the usual binders, color sensitizers or chemical activators and, if required or desired, in the presence of additives which improve the layer properties.

The thickness of the photoconductor layer is in the range of from 1 to 50 $\mu$m, the lower values in the range of from about 1 to 15 $\mu$m being preferred. It has proved advantageous to apply the photoconductor layer to a support. Suitable supports for this purpose are the supports usual in electrophotography which also have been used hitherto for this purpose. Examples thereof are aluminium or metallized plastics. The selection is determined by the purpose for which it is used.

The method of electron beam recording is substantially known. The irradiation conditions depend on the properties of the photoconductor layers to be irradiated. It has been proven that the minimum energy to be transferred to the layer has to be about $10^{-4}$ W sec/cm$^2$. In order to achieve an optimum range for the monoenergetic electrons, the energy of the electrons has to be adjusted to the thickness of the photoconductor layer. The electrons shall not have a kinetic energy below 10 KEV.

In accordance with the present invention, the image information incorporated into the photoconductor layer may be utilized in various ways. It may be electrophotographically converted into a visible image by electrostatic charge, if required exposed to light and toner applied, which toner application is fixed or transferable. Further processing into printing forms is also possible, or it may be read by scanning with the aid of an electron beam of low energy.

With reference to FIG. 2 the present invention provides a process for the storage and reproduction of information in which the photoconductive recording material 10 containing a substrate 12 and coating 14 is image-wise irradiated at 16 with an electron beam 18. A permanent conductivity pattern (dark conductivity) is image-wise produced on the photoconductive recording material 10, to which pattern a free charge is applied by means of corona 20 and the flowing off of this charge differing in correspondence with this charge pattern is made visible where the recording material provided with the conductivity pattern is uniformly charged over the entire surface and the charge pattern formed is made visible with an electrophotographic reversal developer 24 from hopper 22.

To determine the conditions for retrieving the stored image information, the following procedure is applied.

First, the light discharge curve of the non-electron-irradiated photoconductor layer (Curve I) is taken in the usual manner — R.M. Schaffert, Electrophotography, Focal Press, 1966, pages 244 ff. Then the curve of the irradiated photoconductor layer is determined. When obtaining Curve A the photoconductivity has been decreased. When obtaining Curve B, however, the photoconductor has become an insulator. When scarcely any charge is achieved, such as indicated in the case of Curve C the layer has become a dark conductor.

When, with the irradiated photoconductor layer, a curve has been determined which corresponds to Curve C, exposure to light during the retrieval of information is disadvantageous.

The process of the present invention is employed, for example, for the conversion of a television image into a copy or a printing form or also for electronic data storage.

The present invention will be more fully understood by reference to the following illustrative examples demonstrating its large application range.

EXAMPLE 1

To a polyester film made superficially conductive by vapor deposition of aluminum, there is applied a solution of 19.3 g of polyvinyl carbazole, 31.5 of trinitrofluorenone, and 4.2 g of a copolyester of terephthalic acid and isophthalic acid (No. 49,000, manufactured by DuPont de Nemours, U.S.A.) in 545 g of tetrahydrofuran in such a manner that the layer thickness is about 15 $\mu$m after the evaporation of the solvent. The photoconductor layer consisting of a charge transfer complex from polyvinyl carbazole/trinitrofluorenone is imagewise treated with an electron beam of 0.5 W sec/cm$^2$. A comparision test showed that the irradiation led to a relatively considerable decrease of the photoelectric properties of the layer. By imagewise irradiation, a latent image is obtained representing stored information. The image may be made visible by negatively charging the photoconductor layer by means of a corona to about 800 V, exposing the photoconductor layer for about 0.5 sec to a 15 W incandescent bulb at a distance of 20 cm and developing the image with toner. The toner image may be transferred in known manner to a support, e.g. paper. After removal of the residual toner image, the photoconductor layer may be stored as an image storage.

EXAMPLE 2

A solution of 41 g of 2,5-bis-(4'-diethylaminophenyl)-1,3,4-oxdiazole, 41 g of a copolymer of styrene and maleic acid anhydride at a ratio of 1:1 with a softening point of 210° C., and 0.1 g of Rhodamine B extra (Schultz, Farbstofftabellen (Dyestuff Tables), 1st volume, 7th edition, 1931, No. 864, page 365) in 730 g of glycol monomethyl ether, 180 g of butyl acetate, and 4 g of methanol is applied to a superficially mechanically roughened aluminum foil. After evaporation of the solvent, the thickness of the photoconductor layer is about 4 $\mu$m. The layer decreased in its photoelectric properties by irradiation with electrons is then image-wise irradiated with electrons of 0.5 W sec/cm$^2$, an image being obtained which can be converted into a printing form. For this purpose, the photoconductor layer is negatively charged by means of a corona to 400 V, exposed for 2 seconds to a 100 W incandescent bulb at a distance of 60 cm and a toner is applied in known manner. After fixation of the toner image by heat, the photoconductor layer is removed in known manner in the areas not covered with toner. A printing form is obtained the printing image areas of which correspond to the areas struck by the electron beam.

EXAMPLE 3

To a superficially mechanically roughened aluminum foil, there is applied a solution of 17 g of 2-(4'-diethylaminophenyl)-6-methylbenzthiazole dimethyl sulphonamide, and 17 g of an after-chlorinated polyvinyl chloride in 450 g of tetrahydrofuran. After evaporation of the solvent, a photoconductor layer is obtained which is irradiated with an electron beam of $7\cdot10^{-2}$ W sec/cm$^2$. In the irradiated areas, the layer becomes dark-conductive. The recorded information may be read by means of a scanning electron beam of $5\cdot10^{-3}$ W sec/cm$^2$, the current impulses occurring on the image areas being recorded by means of a cathode ray oscillograph.

EXAMPLE 4

In 450 g of benzene 17 g of 2-(4'-dimethylaminophenyl)-4-(4'-chlorophenyl)-5-)4'-dimethylaminophenyl)-oxazole and 17 g of a condensation resin from acetophenone and formaldehyde (Kunstharz AP manufactured by Chemische Werke Huels, Germany) with a melting point off about 80° C. are dissolved. The solution is used to coat an electroconductive support material in the form of a 100 $\mu$m thick aluminum foil. By electron irradiation with an energy per unit area of 0.5 W sec/cm$^2$, a recorded information is obtained which may be made visible in that the layer is electrostatically positively charged and treated with an electrophotographic developer the toner particles of which are charged electrostatically positively.

EXAMPLE 5

A photosemiconductor layer obtained by dissolving 59 g of 3-bromopyrene resin and 6 g of 3,6-dinitronaphthalene-1,8-dicarboxylic acid anhydride in 350 g of tetrahydrofuran, applying the solution to a conductive supoort and evaporating the solvent is irradiated with an electron beam of 11 KEV so that the energy transferred by the beam to the photosemiconductor layer is $5\cdot10^{-2}$ W sec/cm$^2$. The photoconductor properties are slightly decreased thereby. The recorded information may be made visible in that the photoconductor layer is negatively charged to about 300 V, exposed for about 0.2 second to a 100 W incandescent bulb at a distance of 60 cm and treated with an electrophotographic developer the toner particles of which are positively charged.

EXAMPLE 6

A photosemiconductor layer of amorphous selenium as described in J. H. Dessauer and H. E. Clark, Xerography, pages 70 ff. is so irradiated with an electron beam that the transferred energy is 10 W sec/cm$^2$. For this purpose, a beam of an energy of 10 KEV and a beam current of 20 $\mu$A is caused to act for 10 seconds upon a surface of 20 mm$^2$. This effects crystallization of the amprphous selenium layer. The recorded information may be made visible by positive charge of the layer and development with a toner the particles of which are positively charged. The tone image obtained may be transferred in known manner, e.g., to paper.

EXAMPLE 7

In a solution of 12 g of an alkyd resin in 100b g of toluene 48 g of zinc oxide are finely dispersed. The dispersion is applied to a conductive support, e.g., a metal foil, and the solvent is evaporated. The residual photoconductor layer is imagewise irradiated for 5 seconds with an electron beam of 11 KEV and a beam current of 4 $\mu$A. For the reproduction of the image, the layer is negatively charged to 350 V, exposed for 1 second to 100 W incandescent bulb at a distance of 60 cm and treated with an electophotographic developer.

EXAMPLE 8

The procedure is the same as in Example 7 with the exception that cadmium sulphide is used as the photoconductor instead of zinc oxide. The input of information into the layer is performed by means of an electron beam of a current of 100 $\mu$A and a beam energy of 10 KEV. The reproduction of the information may be performed, for example, in that the cadmium sulphide layer is electrostatically charged to $-90$ V, exposed for 10 seconds to a 100 V incandescent bulb at a distance of 60 cm and developed with a toner.

What is claimed is:

1. A process for the storage and reproduction of information in which photoconductive recording material is altered by means of image-wise irradiating the surface of said recording material with an electron beam in correspondence with an information to produce a conductivity pattern and used for the reproduction of the information comprising irradiating uncharged photoconductive recording material in the absence of an electric field with an electron beam, applying to the thus produced conductivity pattern a free charge uniformly over the entire surface of the recording material in the absence of light and treating the surface of the recording material with an electrophotographic toner to make visible the charge pattern formed by said uniform charge.

2. The process according to claim 1, wherein recording material with an organic photoconductor is used.

* * * * *